(12) United States Patent
Nakano et al.

(10) Patent No.: US 8,625,386 B2
(45) Date of Patent: Jan. 7, 2014

(54) NON-VOLATILE MEMORY DEVICE, CIRCUIT BOARD, PRINTING MATERIAL CONTAINER AND PRINTER

(75) Inventors: Shuichi Nakano, Shiojiri (JP); Lim Cheow Guan, Singapore (SG)

(73) Assignee: Seiko Epson Corporation, Tokyo (JP)

(*) Notice: Subject to any disclaimer, the term of this patent is extended or adjusted under 35 U.S.C. 154(b) by 98 days.

(21) Appl. No.: 13/426,911

(22) Filed: Mar. 22, 2012

(65) Prior Publication Data

US 2013/0250710 A1 Sep. 26, 2013

(51) Int. Cl.
*G11C 7/10* (2006.01)

(52) U.S. Cl.
USPC .......... 365/238.5; 365/185.12; 365/189.04; 711/103; 711/150; 714/6.22; 714/6.23; 358/1.14; 358/1.16

(58) Field of Classification Search
USPC .......... 365/185.12, 189.04, 238.5; 711/103, 711/150; 714/6.22, 6.23; 358/1.14–1.18
See application file for complete search history.

(56) References Cited

U.S. PATENT DOCUMENTS 5,432,922 A * 7/1995 Polyzois et al. ........... 714/6.23
7,296,128 B2 * 11/2007 Lee ........................... 711/165
8,307,149 B2 * 11/2012 Honda et al. .............. 711/103
2005/0182892 A1 8/2005 Nakanishi et al.
2011/0208905 A1 * 8/2011 Shaeffer et al. ........... 711/103
2012/0047410 A1 2/2012 Sato et al.
2012/0092696 A1 4/2012 Nakano

FOREIGN PATENT DOCUMENTS

JP 63-279347 11/1988
JP 04-305657 10/1992
JP 2004-280752 10/2004

* cited by examiner

*Primary Examiner* — Harry W Byrne
*Assistant Examiner* — Lance Reidlinger

(57) ABSTRACT

A non-volatile memory device includes first and second memory regions to store data and a memory control unit. Each of the first and second memory regions is configured by a plurality of physical pages. Each of the physical pages is configured by a plurality of regions corresponding to a plurality of logical addresses. The memory control unit performs control of batch erasing and batch writing on every physical page. When a first physical page in the first memory region includes a first region corresponding to a first logical address, which is a target to be written, and when a second physical page in the second memory region includes a second region corresponding to the first logical address, which is a target to be written, the memory control unit selects either the first physical page or the second physical page as a physical page for writing.

8 Claims, 12 Drawing Sheets

FIG. 2A

| LOGICAL ADDRESS | MA1 | | | MA2 | | |
|---|---|---|---|---|---|---|
| | PHYSICAL PAGE | DATA | ERROR DETECTION BITS | PHYSICAL PAGE | DATA | ERROR DETECTION BITS |
| A0 | P0a | x | "NG" | P0b | 01h | "OK" |
| A1 | | 0Fh | "OK" | | 0Fh | "OK" |
| A2 | P1a | 10h | "OK" | P1b | 0Fh | "OK" |
| A3 | | 82h | "OK" | | 82h | "OK" |

FIG. 2B

| LOGICAL ADDRESS | MA1 | | | MA2 | | |
|---|---|---|---|---|---|---|
| | PHYSICAL PAGE | DATA | ERROR DETECTION BITS | PHYSICAL PAGE | DATA | ERROR DETECTION BITS |
| A0 | P0a | 02h | "OK" | P0b | 01h | "OK" |
| A1 | | 0Fh | "OK" | | 0Fh | "OK" |
| A2 | P1a | 10h | "OK" | P1b | 0Fh | "OK" |
| A3 | | 82h | "OK" | | 82h | "OK" |

ERASING/WRITING BY PHYSICAL PAGE UNIT

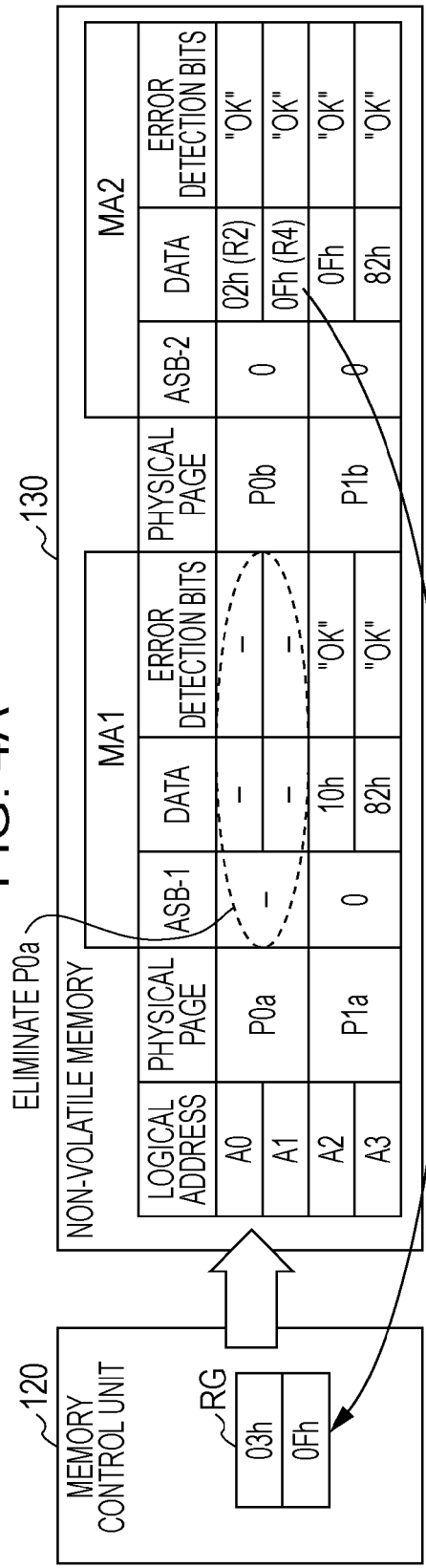
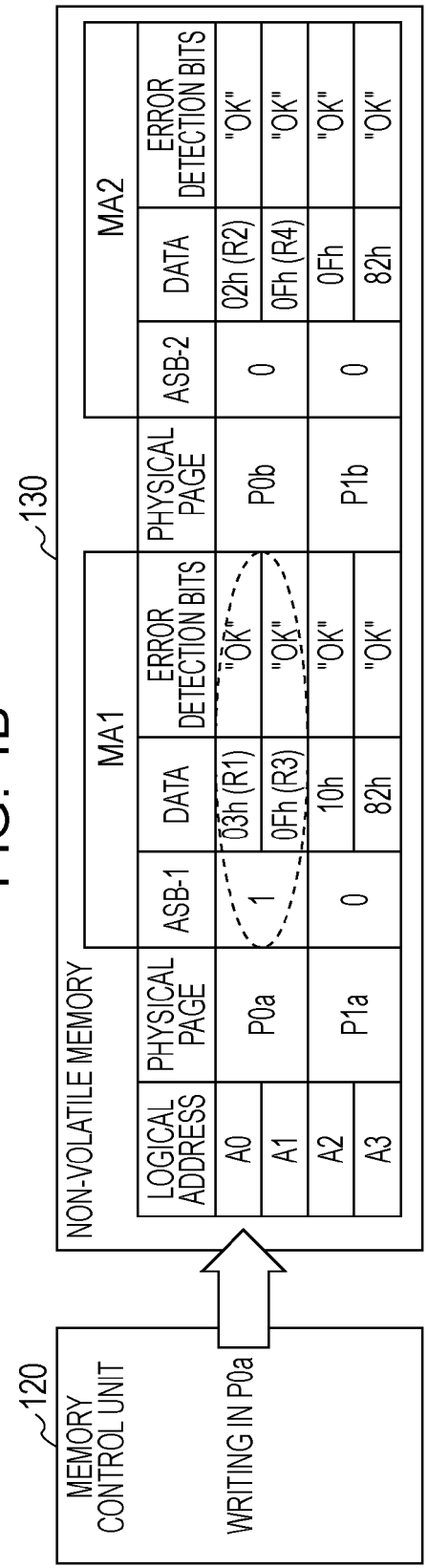

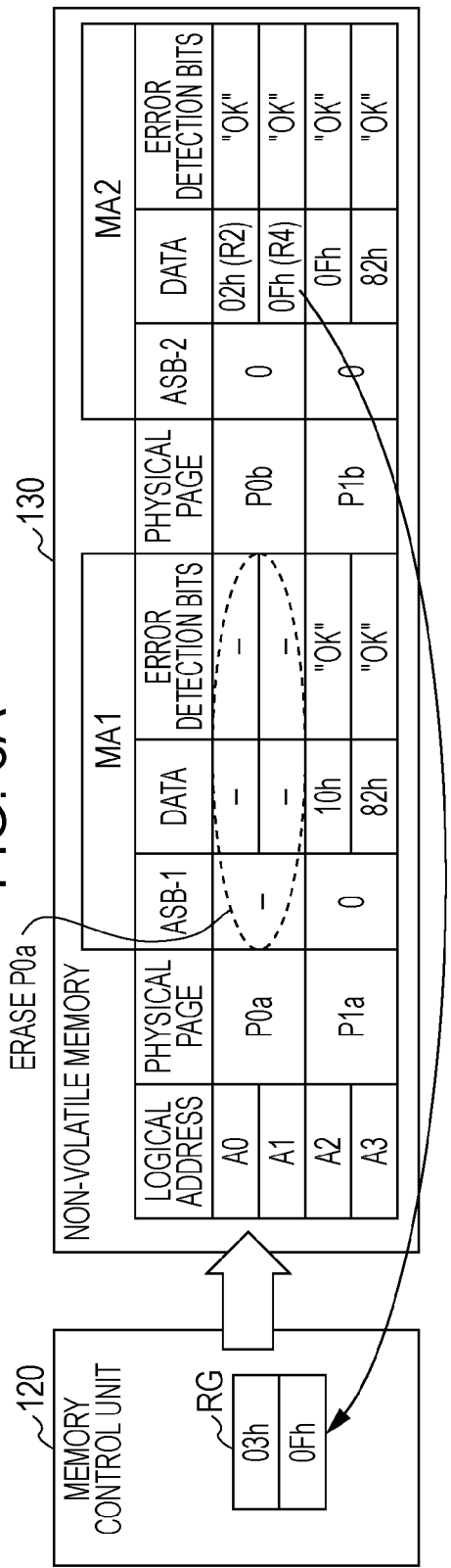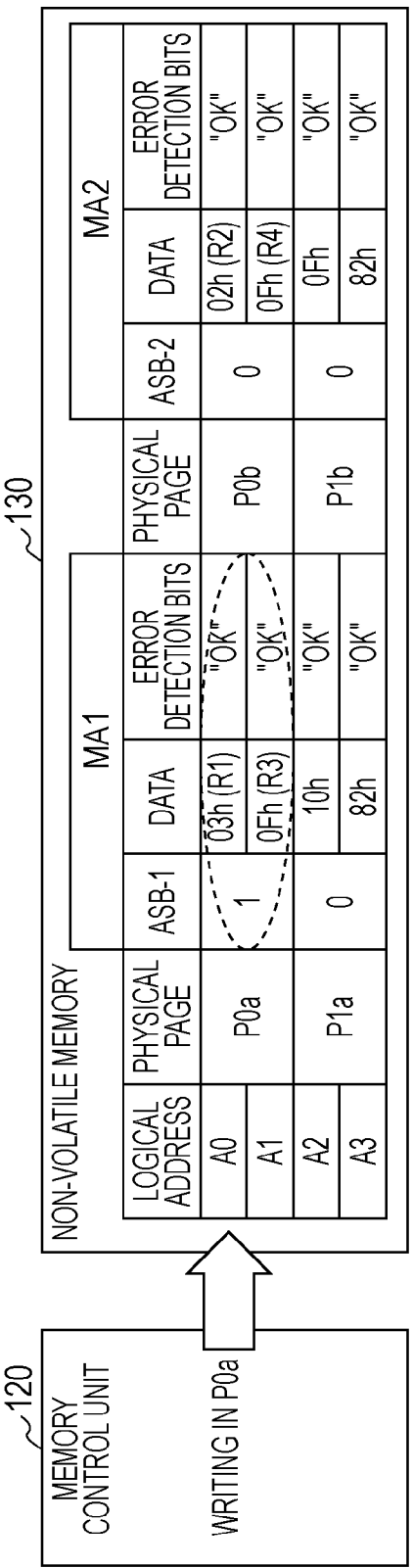

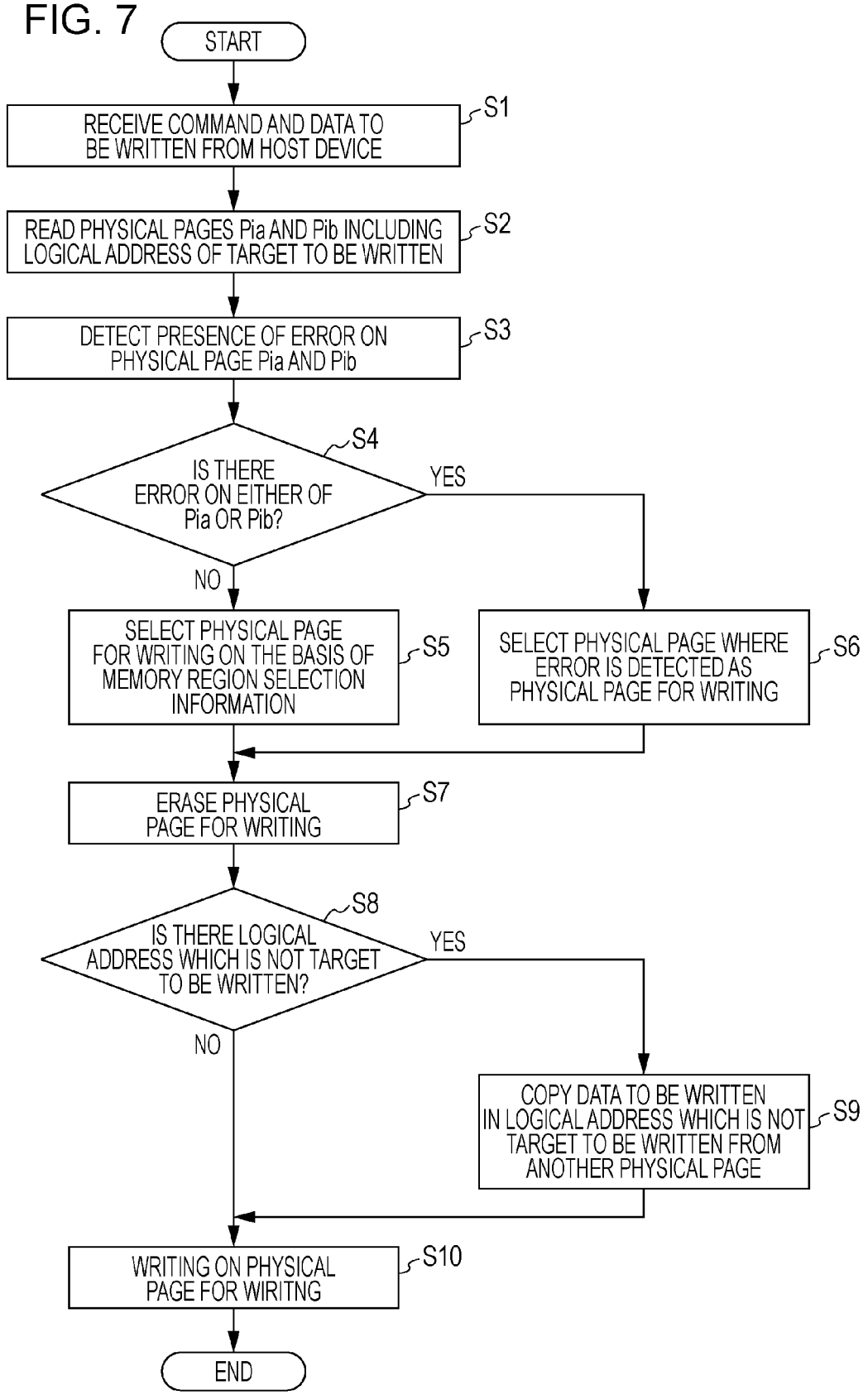

FIG. 9A

| ERROR DETECTION RESULT | | SELECTED PHYSICAL PAGE | |
|---|---|---|---|
| Pia | Pib | FOR WRITING | FOR READING |
| OK | OK | SELECT BY ASB | SELECT BY ASB |
| OK | NG | Pib | Pia |
| NG | OK | Pia | Pib |
| NG | NG | NOT SELECTED | NOT SELECTED |

FIG. 9B

| SELECTION INFORMATION | | SELECTED PHYSICAL PAGE | |
|---|---|---|---|
| ASB-1 | ASB-2 | FOR WRITING | FOR READING |
| 0 | 0 | Pia | Pib |
| 1 | 0 | Pib | Pia |
| 1 | 1 | Pia | Pib |
| 0 | 1 | Pib | Pia |
| 0 | 0 | Pia | Pib |

FIG. 9C

| ERROR DETECTION RESULT | | PHYSICAL PAGE FOR WRITING | BEFORE WRITING | | AFTER WRITTEN | |
|---|---|---|---|---|---|---|
| Pia | Pib | | ASB-1 | ASB-2 | ASB-1 | ASB-2 |
| NG | OK | Pia | 0 | 0 | 1 | 0 |
| | | | 1 | 0 | 1 | 0 |
| | | | 1 | 1 | 0 | 1 |
| | | | 0 | 1 | 0 | 1 |
| OK | NG | Pib | 0 | 0 | 0 | 0 |
| | | | 1 | 0 | 1 | 1 |
| | | | 1 | 1 | 1 | 1 |
| | | | 0 | 1 | 0 | 0 |

NON-VOLATILE MEMORY DEVICE, CIRCUIT BOARD, PRINTING MATERIAL CONTAINER AND PRINTER

BACKGROUND ART

The present invention relates to a non-volatile memory device, a printing material container, a printer or the like.

As an ink cartridge (printing material container) used in a printer of ink jet type, there is an ink cartridge to which a memory device is installed. In this memory device, for example, information such as colors of inks and ink consumption is stored. Data regarding the ink consumption is transmitted to the memory device from a printer main body (host device) and is written in a non-volatile memory or the like included in the memory device. However, since the ink cartridge is generally configured to be exchangeable, there are concerns that a bad connection may easily occur in an electrical connection portion and if a communication error occurs due to the bad connection, erroneous data may be written.

Regarding this problem, for example, a technique which continues control using data written in another memory region even when data corruption occurs during writing by providing a plurality of memory regions in a memory and by alternately writing data in the memory regions is disclosed in JP-A-2004-280752.

However, in this technique, there is a problem in that since the data is written by a physical page unit, when only a portion among logical addresses included in one physical page is desired to be rewritten, it is necessary to transmit the data regarding all of the logical addresses included in the physical page from the host device.

SUMMARY

An aspect of the present invention relates to a non-volatile memory device including a control unit performing a communication process with a host device; a non-volatile memory including a first memory region and a second memory region storing data to be written transmitted from the host device; and a memory control unit performing reading and writing of the non-volatile memory, wherein the first memory region and second memory region are configured by each of the physical pages, wherein each of the physical pages is configured by a plurality of regions corresponding to a plurality of logical addresses, wherein the memory control unit performs control of batch erasing and batch writing on every physical page, wherein when a first physical page in the first memory region includes a first region corresponding to a first logical address, which is a target to be written, of the data to be written transmitted from the host device and when a second physical page in the second memory region includes a second region corresponding to the first logical address, which is a target to be written, the memory control unit selects either of the first physical page in the first memory region or the second physical page in the second memory region as a physical page for writing and selects the other as a physical page for reading, wherein when the first physical page is selected as the physical page for writing, the memory control unit writes the data to be written in the first region corresponding to the first logical address which is the target to be written, and wherein when the first physical page, selected as the physical page for writing, includes a third region corresponding to the second logical address which is not the target to be written and the second physical page, selected as the physical page for reading, includes a fourth region corresponding to the second logical address which is not the target to be written, the memory control unit copies and writes data stored in the fourth region corresponding to the second logical address which is not the target to be written in the third region corresponding to the second logical address which is not the target to be written.

Another aspect of the present invention relates to a printing material container including the non-volatile memory device of any one described above.

A still another aspect of the present invention relates to a printer including the non-volatile memory device and the host device of any one described above.

BRIEF DESCRIPTION OF DRAWINGS

FIG. 2A and FIG. 2B are explanatory diagrams illustrating erasing and writing processes of comparison examples.

FIG. 4A and FIG. 4B are third and fourth explanatory diagrams illustrating erasing and writing processes when the errors are not detected in the non-volatile memory device.

FIG. 6A and FIG. 6B are the third and fourth explanatory diagrams illustrating erasing and writing processes when the errors are detected in the non-volatile memory device.

FIG. 7 is an example of a flowchart of writing control of the non-volatile memory device.

FIG. 9A, FIG. 9B and FIG. 9C are explanatory diagrams of memory region selection by a memory control unit.

DESCRIPTION OF EXEMPLARY EMBODIMENTS

Figure 1:
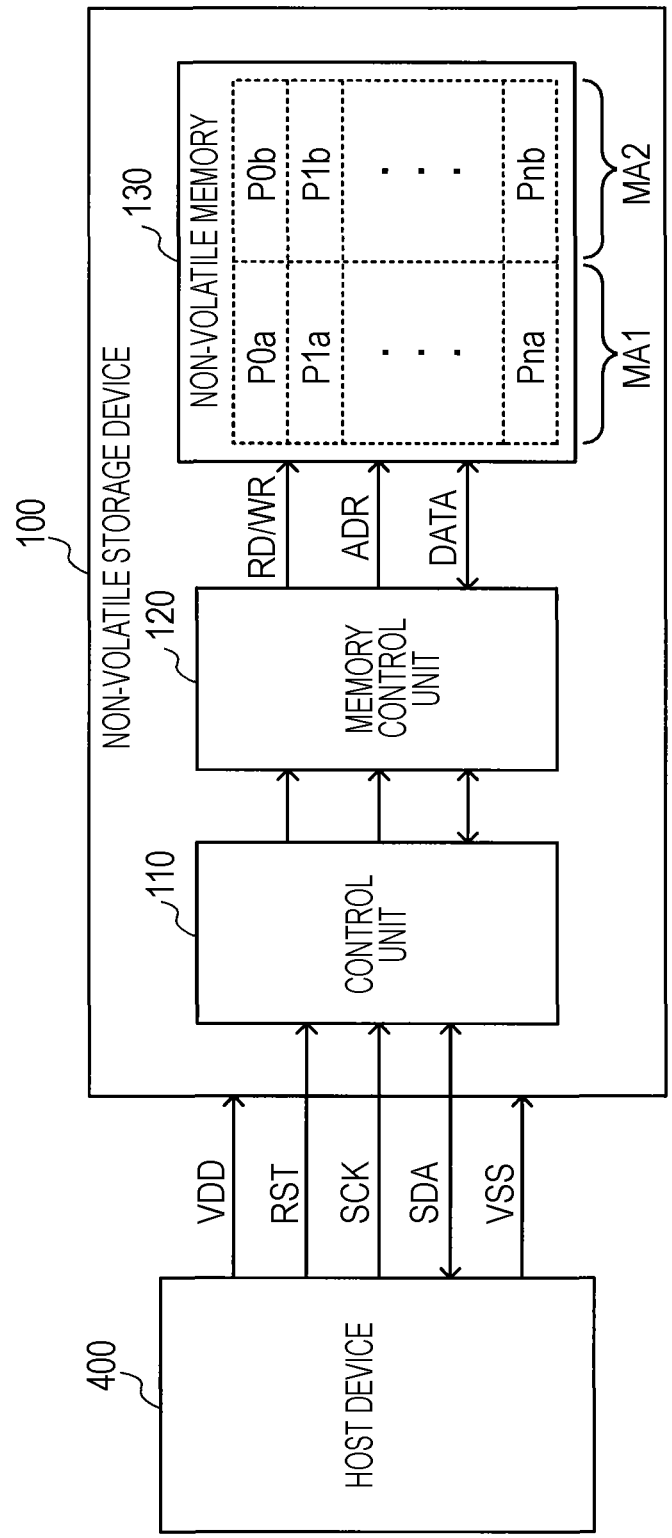
FIG. 1 is a basic configuration example of a non-volatile memory device.

According to some aspects of the present invention, it is possible to provide a non-volatile memory device, a printing material container and a printer capable of attaining efficient writing process and improving reliability of data stored.

An aspect of the present invention relates to the non-volatile memory device including a control unit to perform a communication process with a host device; a non-volatile memory including a first memory region and a second memory region to store data to be written transmitted from the host device; and a memory control unit to perform control of reading and writing of the non-volatile memory, wherein the first memory region and second memory region are configured by each of physical pages, wherein each of the physical pages of the physical pages is configured by a plurality of regions corresponding to a plurality of physical addresses, wherein the memory control unit performs control of batch erasing and batch writing on every physical page, wherein when a first physical page in the first memory region includes a first region corresponding to a first logical address, which is a target to be written, of the data to be written transmitted from the host device and when a second physical page in the second memory region includes a second region corresponding to the first logical address, which is a target to be written, the memory control unit selects either of the first physical page in the first memory region or the second physical page in the second memory region as a physical page for writing and selects the other as a physical page for reading, wherein when the first physical page is selected as the physical page for writing, the memory control unit writes the data to be written in the first region corresponding to the first logical address which is the target to be written, and wherein when the first physical page, selected as the physical page for writing, includes a third region corresponding to the second logical address which is not the target to be written and the second physical page, selected as the physical page for reading, includes a fourth region corresponding to the second logical address which is not the target to be written, data stored in the fourth region corresponding to the second logical address which is not the target to be written is copied and written in the third region corresponding to the second logical address which is not the target to be written.

In this aspect of the present invention, it is possible to reduce data corruption or the like due to a communication error since the data to be written may be received with respect to the logical address of the target to be written and dummy data may be received with respect to the logical address which is not the target to be written. In addition, since it is possible to reduce a data amount of the data to be written, prepared by the host device, a capacity of data buffering of the host device can be reduced. As a result, it is possible to attain the efficient writing process and improve the reliability of the data stored.

Moreover, in the aspect of the present invention, it is preferable that each of the first memory region and the second memory region stores memory region selection information in addition to the data to be written in every physical page or in every region corresponding to the logical address and the memory control unit reads the memory region selection information from both of the first physical page including the first region corresponding to the first logical address of the target to be written and the second physical page including the second region corresponding to the first logical address, selects either of the first physical page or the second physical page as the physical page for writing on the basis of the memory region selection information and selects the other as the physical page for reading.

According to the aspect described above, the memory control unit can perform the writing and reading by alternately selecting the physical page in the first memory region and the physical page in the second memory region.

In addition, in the aspect of the present invention, it is preferable that each of the first memory region and second memory region stores error detection information in addition to the data to be written in every region corresponding to the logical address, the memory control unit reads the error detection information from both of the first physical page including the first region corresponding to the first logical address of the target to be written and the second physical page including the second region corresponding to the first logical address and analyzes the presence of the error, and wherein when the error is detected from either of the first physical page or the second physical page, the memory control unit selects the physical page on which the error is detected as the physical page for writing and selects the physical page on which the error is not detected as the physical page for reading.

According to the aspect described above, since when the error occurs on either of two physical pages including the region corresponding to the first logical address of the target to be written, the memory control unit can write the data to be written which is received from the host device in the first logical address of the target to be written of the physical page on which the error occurs and the data copied from the physical page for reading in the second logical address which is not the target to be written, it is possible to recover the data on the physical page on which the error occurs. As a result, it is possible to improve the reliability of the data stored.

Furthermore, in the aspect of the present invention, it is preferable that the memory control unit performs control to sequentially increment the logical address on the basis of a clock signal from the host device.

According to the aspect described above, the memory control unit can generate the corresponding logical address with respect to the data sequentially transmitted from the host device.

In addition, in the aspect of the present invention, it is preferable that after receiving a command to be written from the host device, the control unit sequentially receives a receiving packet including the data to be written and writing enable bits to be written by every logical address unit in synchronization with the clock signal and when the memory control unit receives the receiving packet and writing enable bit to be active, the memory control unit sets the logical address corresponding to the receiving packet as the logical address of the target to be written.

According to the aspect described above, when the writing enable bits are not active, the memory control unit can set the received data not to be written.

In addition, another aspect of the present invention relates to a printing material container including the non-volatile memory device of any one described above.

Moreover, a still another aspect of the present invention relates to a printer including the non-volatile memory device and the host device of any one described above.

Hereinafter, favorable embodiments of the present invention will be described in detail. The embodiments which will be described hereinafter do not unreasonably limit the specification of the present invention described in the scope of the claims and all configurations described in the present embodiment are not limited to be essential as solutions of the present embodiment.

1. A Non-Volatile Memory Device

FIG. 1 shows a basic configuration example of a non-volatile memory device 100 of a present embodiment. The non-volatile memory device 100 according to the embodiment of the present invention includes a control unit 110, a memory control unit 120 and a non-volatile memory 130. In addition, the non-volatile memory device 100 according to the present embodiment is not limited to the configuration shown in FIG. 1 and various modifications such as a portion of configuration elements thereof may be omitted, a portion of configuration elements may be replaced with other configuration elements, or other configuration elements may be added can be allowed.

The non-volatile memory device 100 of the present embodiment is a non-volatile memory device installed to an ink cartridge (printing material container) used in a printer of ink jet type, for example, and information such as ink consumption or the like transmitted from a printer main body (host device) is stored. In an ink cartridge (liquid container), a bad connection in an electrical connection portion which connects the printer main body and the non-volatile memory device may occur since the ink cartridge is generally configured to be exchangeable. For this reason, there is a concern that a communication error due to a bad connection of a data signal terminal and a writing error due to a bad connection of a power terminal during the writing may occur.

According to the non-volatile memory device 100 of the present embodiment, since the host device transmits data to be written with respect to a logical address of a target to be written and transmits dummy data with respect to a logical address which is not a target to be written, it is possible to reduce data corruption due to the communication error. In addition, even when the data corruption occurs due to the writing error, the data can be recovered.

The control unit 110 performs a communication process with a host device 400. Specifically, the control unit 110 performs transmitting and receiving of a data signal SDA between the control unit and the host device 400 and receives a reset signal RST and a clock signal SCK from the host device 400. In addition, the control unit 110 detects the presence of the communication error of the received data. The detection of the communication error can be performed using a technique such as parity check, for example. The received data is, for example, the ink consumption of the ink cartridge of the printer or the like.

The non-volatile memory 130 is a non-volatile memory in which, for example, batch erasing or batch writing is performed in a flash memory or the like and includes a first memory region MA1 and a second memory region MA2 for storing the data to be written transmitted from the host device 400. The first and second memory regions MA1 and MA2 are respectively configured of a plurality of physical pages P0a to Pna and P0b to Pnb (n is a natural number) and each of the physical pages of the plurality of physical pages P0a to Pna and P0b to Pnb is configured of regions corresponding to a plurality of logical addresses. For example, the physical page P0a is configured of a region corresponding to logical addresses A0 and A1 and the P0b is also configured of the region corresponding to the logical addresses A0 and A1. The P0a and P0b are respectively included in separated memory regions MA1 and MA2 but correspond to the common logical addresses A0 and A1. In addition, a specific configuration of the first and second memory regions MA1 and MA2 will be described later.

The memory control unit 120 performs control of reading and writing of the non-volatile memory 130. Specifically, the memory control unit 120 outputs reading/writing control signals RD/WR and an address signal ADR to the non-volatile memory 130 and sends and receives the data to be written or the data to be read DATA.

The memory control unit 120 performs control of batch erasing or batch writing on every physical page of P0a to Pna and P0b to Pnb. For example, when the physical page P0a is configured of the region corresponding to the logical addresses A0 and A1, the memory control unit 120 performs the control of erasing and writing with respect to the region corresponding to the logical addresses A0 and A1 of the physical page P0a.

The memory control unit 120 selects either of the first physical page (for example, P0a) in the first memory region MA1 including the first region corresponding to the first logical address (for example, A0) of the target to be written of the data to be written, transmitted from the host device 400 or the second physical page (for example, P0b) in the second memory region MA2 including the second region corresponding to the first logical address (for example, A0) among the plurality of physical pages as a physical page for writing and selects the other as a physical page for reading. Then, the memory control unit 120 writes the data to be written in the first region corresponding to the first logical address (for example, A0) of the target to be written of the physical page for writing (for example, P0a).

Furthermore, when the physical page for writing (for example, P0a) includes a third region corresponding to the second logical address (for example, A1) which is not the target to be written and the physical page for reading includes a fourth region corresponding to the second logical address (for example, A1) which is not the target to be written, the data stored in the fourth region corresponding to the second logical address (for example, A1) which is not the target to be written of the physical page for reading (for example, P0b) is copied and written in the third region corresponding to second logical address (for example, A1) which is not the target to be written of the physical page for writing (for example, P0a).

By doing so, the host device 400 may transmit the data to be written with respect to the logical address of the target to be written and may transmit the dummy data with respect to the logical address which is not the target to be written, thereby reducing the data corruption due to the communication error. Moreover, since the data amount of the data to be written prepared by the host device 400 can be reduced, the capacity of data buffering of the host device 400 can be reduced. In addition, the erasing and writing control of the memory control unit 120 will be described in detail.

Here, a plurality of the first logical addresses of the target to be written may be used and a plurality of the second logical addresses which is not the target to be written may be used.

In each of the first memory region MA1 and the second memory region MA2, memory region selection information is stored on every physical pages P0a to Pna and P0b to Pnb or in every region corresponding to the logical addresses A0, A1, A2 and the like in addition to the data to be written.

The memory control unit 120 reads the memory region selection information from both of the first physical page (for example, P0a) including the first region corresponding to the first logical address (for example, A0) of the target to be written and the second physical page (for example, P0b) including the second region corresponding to the first logical address (for example, A0). Then, on the basis of the memory region selection information, either of the first physical page (for example, P0a) or the second physical page (for example, P0b) is selected as the physical page for writing and the other is selected as the physical page for reading. By doing so, it is possible to alternately select the first physical page and the second physical page for performing the writing and reading. In addition, the memory region selection information will be described in detail later.

In each of the first memory region MA1 and the second memory region MA2, error detection information is stored in every region corresponding to the logical addresses A0, A1, A2 and the like in addition to the data to be written.

The memory control unit 120 reads the error detection information from both of the first physical page (for example, P0a) including the first region corresponding to the first logical address (for example, A0) of the target to be written and the second physical page (for example, P0b) including the second region corresponding to the first logical address (for example, A0) of the target to be written and analyzes the presence of error. When the error is detected from either of the first or second physical pages (for example, P0a or P0b), the physical page (for example, P0a) in which the error is detected is selected as the physical page for writing and the physical page (for example, P0b) in which the error is not detect is selected as the physical page for reading. The error detection can be performed using, for example, techniques of parity check, checksum or the like based on the error detection information.

By doing so, when the error occurs on either of the two physical pages including the region corresponding to the logical address of the target to be written, it is possible to write the data to be written from the host device 400 in the logical address of the target to be written of the physical page on which the error occurs and the data copied from the physical page for reading in the logical address which is not the target to be written, therefore, the data on the physical page on which the error occurs can be recovered. Here, the erasing and writing control when the error is detected will be described in detail later.

The memory control unit 120 performs control to sequentially increment the logical address on the basis of a clock signal SCK from the host device 400. For example, when a receiving packet is configured by 16 bits, the memory control unit 120 increments the logical addresses every 16 clock cycle of the clock signal SCK and generates the logical addresses A0, A1, A2 and the like corresponding to each of the receiving packets.

The control unit 110 sequentially receives the receiving packet including the data to be written and writing enable bits by every logical address unit in synchronization with the clock signal SCK after receiving a command to be written from the host device 400. Subsequently, when the receiving packet in which the writing enable bits are active is received, the memory control unit 120 sets the logical address corresponding to the receiving packet as the logical address of the target to be written. By doing so, when the writing enable bits are inactive, the memory control unit 120 can set the received data not to be written in the non-volatile memory 130. Furthermore, regarding the physical page on which even one of the logical addresses of the target to be written is not included, the memory control unit 120 can set the erasing and writing process not to be performed. Here, a detailed configuration of the receiving packet will be described later.

The host device 400 is a printer main body, for example, and performs, for example, a printing process of the printer, a communication process with the non-volatile memory device 100, a counting process of the ink consumption or the like. In addition, the host device 400 supplies a first power supply voltage (power supply voltage of high voltage) VDD and a second power supply voltage (power supply voltage of low voltage) VSS to the non-volatile memory device 100.

FIG. 2A and FIG. 2B show diagrams illustrating the erasing and writing processes of comparison examples. The configuration in FIG. 2A and FIG. 2B shows a configuration of writing all of the received data from the host device in the non-volatile memory while the receiving packet does not include the writing enable bits as the comparison example. In order to simplify the description, only logical addresses A0 to A3 are shown and one physical page is assumed to be configured by two logical addresses.

In each of the memory region MA1 and MA2, data and error detection bits (error detection information in a broad sense) are stored in every logical address. The data is shown with a hexadecimal number, for example, 0Fh shows the hexadecimal number 0F. The error detection bits (error detection information in the broad sense) are parity bits for the parity check, for example, and show OK when the error is not detected and NG when the error is detected.

FIG. 2A shows a state before writing. The error occurs in a region corresponding to the logical address A0 of the physical page P0a and data corruption occurs. As shown in FIG. 2B, the host device can recover the data by writing new data 02h in the logical address A0. However, since the erasing and writing process is performed by the physical page unit, the host device needs to transmit not only the data 02h to be written in A0 but also the data 0Fh to be written in A1. That is, the host device needs to prepare and transmit the data to be written of not the logical address of which the data needs to be rewritten but all of the logical addresses which constitutes the physical page on which the logical address thereof is included.

According to the non-volatile memory device 100 of the present embodiment, the host device 40 may transmit the dummy data to the logical address which does not need to be written, thereby, the capacity of data buffering of the host device 400 can be reduced.

FIG. 3A, FIG. 3B, FIG. 4A and FIG. 4B shows diagrams illustrating the erasing and writing process when the error is not detected in the non-volatile memory device 100 of the present embodiment. In order to simplify the description, only logical addresses A0 to A3 are shown and one physical page is assumed to be configured by two logical addresses.

In each of the memory regions MA1 and MA2, memory region selection information ASB-1 and ASB-2 are stored in every physical address, and data and error detection bits (error detection information in the broad sense) are stored in every logical address. The data is shown with the hexadecimal number and for example, 0Fh shows the hexadecimal number 0F. The error detection bits (error detection information in the broad sense) are parity bits for the parity check, for example, and show OK when the error is not detected and NG when the error is detected. Here, the memory region selection information ASB-1 and ASB-2 may be stored in every logical address.

Figure 3A:
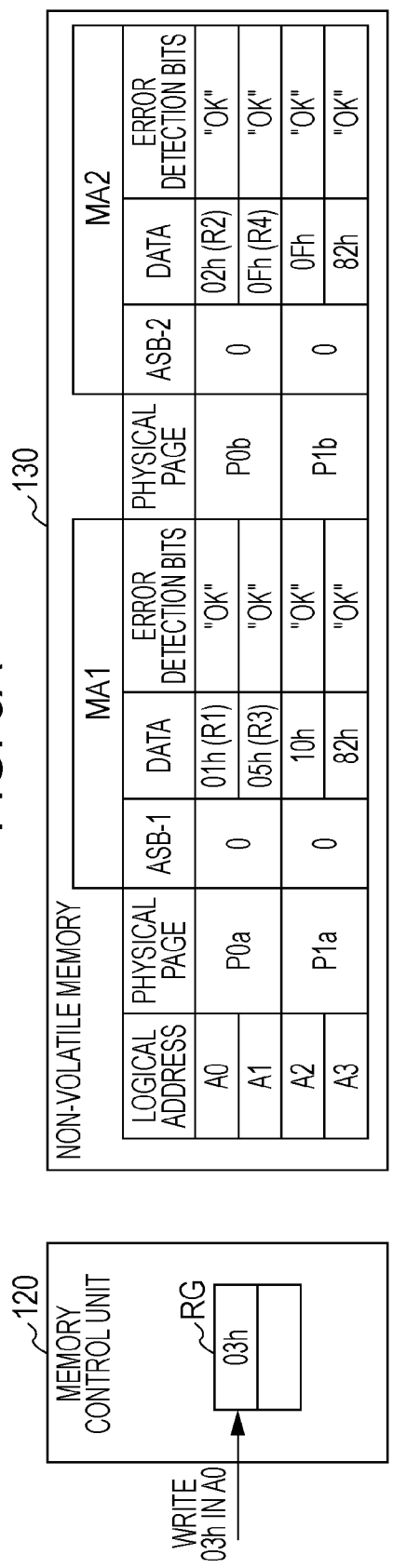
FIG. 3A and FIG. 3B are first and second explanatory diagrams illustrating erasing and writing processes when errors are not detected in the non-volatile memory device.

FIG. 3A shows a state of the non-volatile memory device 130 before writing. The control unit 110 receives a command to be written from the host device 400 and data 03h to be written in the logical address A0 and accommodates the received data 03h to be written in a register RG of the memory control unit 120.

Figure 3B:
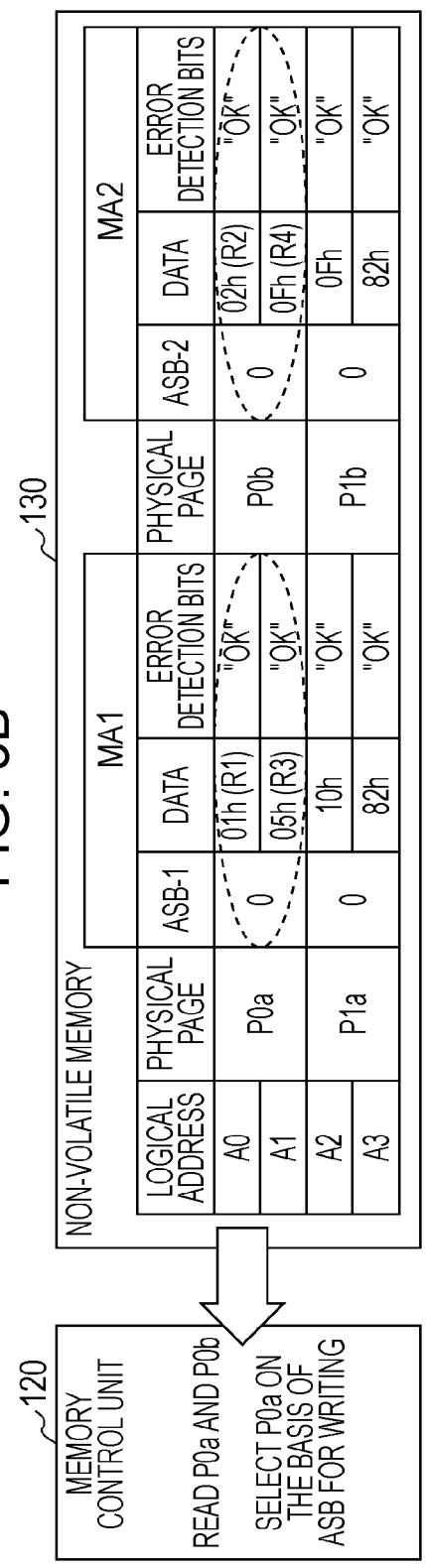

Next, as shown in FIG. 3B, the memory control unit 120 reads the first physical page P0a including a first region R1 corresponding to the first logical address A0 of the target to be written and the second physical page P0b including a second region R2 corresponding to the first logical address A0 of the target to be written and detects the presence of error. Since the error is not detected in either of the physical pages P0a and P0b, the memory control unit 120 selects P0a as the physical page for writing and selects P0b as the physical page for reading on the basis of the memory region selection information ASB-1 and ASB-2 as described later.

Next, as shown in FIG. 4A, the memory control unit 120 erases P0a. At this time, in the register RG, data 0Fh stored in a fourth region R4 corresponding to the second logical address A1 which is not the target to be written of P0b is accommodated. Subsequently, as shown in FIG. 4B, the memory control unit 120 writes a value accommodated in the register RG in P0a. In other words, the data 03h to be written is written in the first region R1 corresponding to the first logical address A0 of the target to be written. Then, the data 0Fh stored in the fourth region R4 corresponding to the second logical address A1 which is not the target to be written is copied and written in a third region R3 corresponding to the second logical address A1 which is not the target to be written. In addition, at this time, the memory region selection information ASB-1 is rewritten to 1. By doing so, when A0 or A1 is accessed at the next time, P0a is selected as the physical page for reading and P0b is selected as the physical page for writing.

As can be seen from above, when the error is not detected, it is possible to alternately select the physical page in the first memory region MA1 and the physical page in the second memory region MA2 and perform the writing and reading.

FIG. 5A, FIG. 5B, FIG. 6A and FIG. 6B show diagrams illustrating the erasing and writing process when the error is detect in the non-volatile memory device 100 of the present embodiment.

Figure 5A:
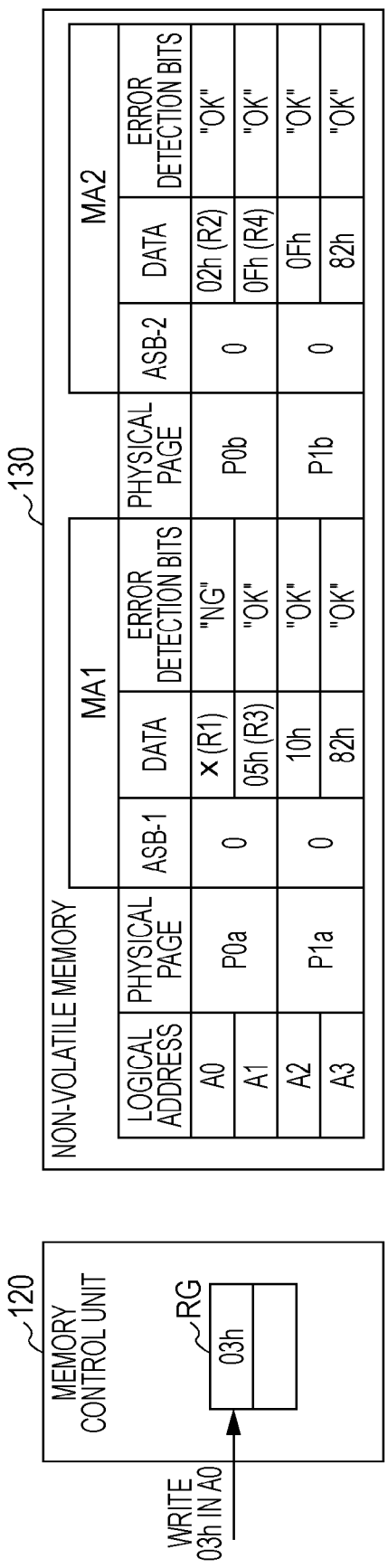
FIG. 5A and FIG. 5B are the first and second explanatory diagrams illustrating the erasing and writing processes when the errors are detected in the non-volatile memory device.

FIG. 5A shows a state of the non-volatile memory 130 before writing. The error occurs in the region corresponding to the logical address A0 of the first physical page P0a and the data corruption occurs. The control unit 110 receives a command to be written from the host device 400 and data 03h to be written in the logical address A0 and accommodates the received data 03h to be written in the register RG of the memory control unit 120.

Figure 5B:
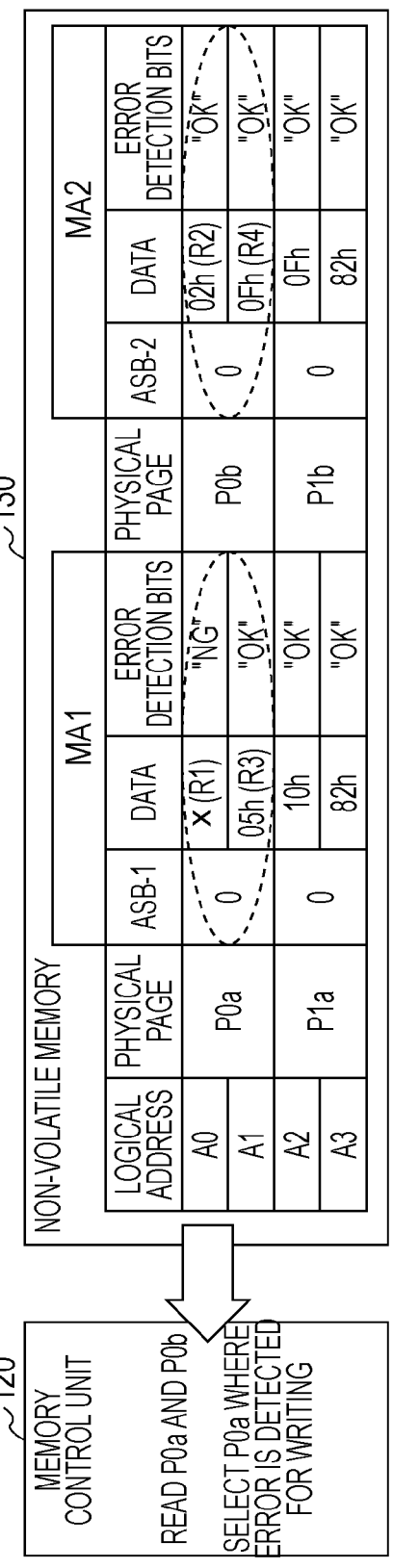

Next, as shown in FIG. 5B, the memory control unit 120 reads the error detection information from both of the first physical page P0a including the first region R1 corresponding to the first logical address A0 of the target to be written and the second physical page P0b including the second region R2 corresponding to the first logical address A0 of the target to be written and analyzes the presence of the error. Since the error is detected on P0a and the error is not detected on P0b, the memory control unit 120 selects the first physical page P0a on which the error is detected as the physical page for writing and selects the second physical page P0b in which the error is not detected as the physical page for reading.

Next, as shown in FIG. 6A, the memory control unit 120 erases P0a. At this time, in the register RG, data 0Fh stored in a fourth region R4 corresponding to the second logical address A1 which is not the target to be written of P0b is accommodated.

Subsequently, as shown in FIG. 6B, the memory control unit 120 writes a value accommodated in the register RG in P0a. In other words, the data 03h to be written is written in the first region R1 corresponding to the first logical address A0 of the target to be written. Then, the data 0Fh stored in the fourth region R4 corresponding to the second logical address A1 which is not the target to be written is copied and written in a third region R3 corresponding to the second logical address A1 which is not the target to be written. In addition, at this time, the memory region selection information ASB-1 is rewritten to 1. By doing so, when A0 or A1 is accessed at the next time, P0a is selected as the physical page for reading and P0b is selected as the physical page for writing.

FIG. 6A and FIG. 6B shows a case when the error occurs in A0 of P0a of the target to be written but for example, even when the error occurs in A1 of P0a which is not the target to be written, the host device 400 sets A0 as the target to be written and transmits the command to be written thereby the error in A1 of P0a which is not the target to be written can be recovered.

As can be seen from the above, when the error is detected from either of the two physical pages including the region corresponding to the logical address of the target to be written, the physical page on which the error is detected is selected as the physical page for writing and the physical page on which the error is not detected is selected as the physical page for reading. When the logical address on which the error occurs is the target to be written, the data is updated with new data from the host device and when the logical address on which the error occurs is not the target to be written, data from the physical page on which the error is not detected is copied and written. The copied data is data written at the previous access time or the access time before the previous access time.

By doing so, when the error occurs on either of the two physical pages including the region corresponding to the logical address of the target to be written, since the data to be written from the host device 400 and the copied data from the physical page on which the error does not occur can be written on the physical page on which the error occurs, the data on the physical page on which the error occurs can be recovered.

Furthermore, by transmitting the command to be written without recognition whether on which physical page the error occurs, the host device 400 can recover all of the data included on the physical page thereof if the error occurs on the physical page including the region corresponding to the logical address of the target to be written.

FIG. 7 is an example of a flowchart of writing control in the non-volatile memory device 100 according to the present embodiment.

First, the control unit 110 receives the command and data to be written from the host device 400 (step S1). Specifically, the control unit 110 decodes the received command and when the received command is the command to be written, the control unit 110 sequentially receives at least one receiving packet (data packet) including the data to be written and the writing enable bits after the command. The memory control unit 120 sequentially increments the logical address on the basis of the clock signal SCK from the host device 400. Subsequently, when the receiving packet in which the writing enable bits are active is received, the logical address corresponding to the receiving packet is set as the logical address of the target to be written. The data to be written of the logical address of the target to be written is accommodated in the register RG of the memory control unit 120.

Next, the memory control unit 120 reads information stored on physical pages Pia and Pib (i is an integer of 0 or more) including the region corresponding to the logical address of the target to be written (step S12). Subsequently, the error detection information of the physical pages Pia and Pib are analyzed and the presence of error is detected (step S3).

Next, the memory control unit 120 determines whether there is the error on either of physical pages Pia and Pib on the basis of the result of error detection (step S4). When the error is not detected on either page, the physical page for writing is selected on the basis of the memory selection information ASB-1 and ASB-2 (step S5). When the error is detected on any page, the physical page on which the error is detected is selected as the physical page for writing (step S6).

Next, the memory control unit 120 erases the information stored in the physical page for writing (step S7). Then, the memory control unit 120 determines whether the logical address which is not the target to be written is included on the physical page for writing (step S8). When the logical address which is not the target to be written is not included, that is, when all of the logical addresses included on the physical page for writing are the targets to be written, the data to be written accommodated in the register RG is written on the physical page for writing (step S10). On the other hand, when the logical address which is not the target to be written is included, the data to be written in the logical address which is not the target to be written is copied in the register RG from the other physical page (physical page for reading) (step S9) and the value of the register RG is written on the physical page for writing (step S10).

Here, when the errors are detected on both of the two physical pages Pia and Pib, not shown, the writing process is not performed and the control unit 110 may be arranged to transmit an error code to the host device 400. However, the possibility that the errors may occur on both of the two physical pages Pia and Pib is extremely low. The reason is that the writing error may be caused due to the bad connection of a power supply terminal during the writing but writing on both of the two physical pages Pia and Pib at the same time hardly occur.

Figure 8:
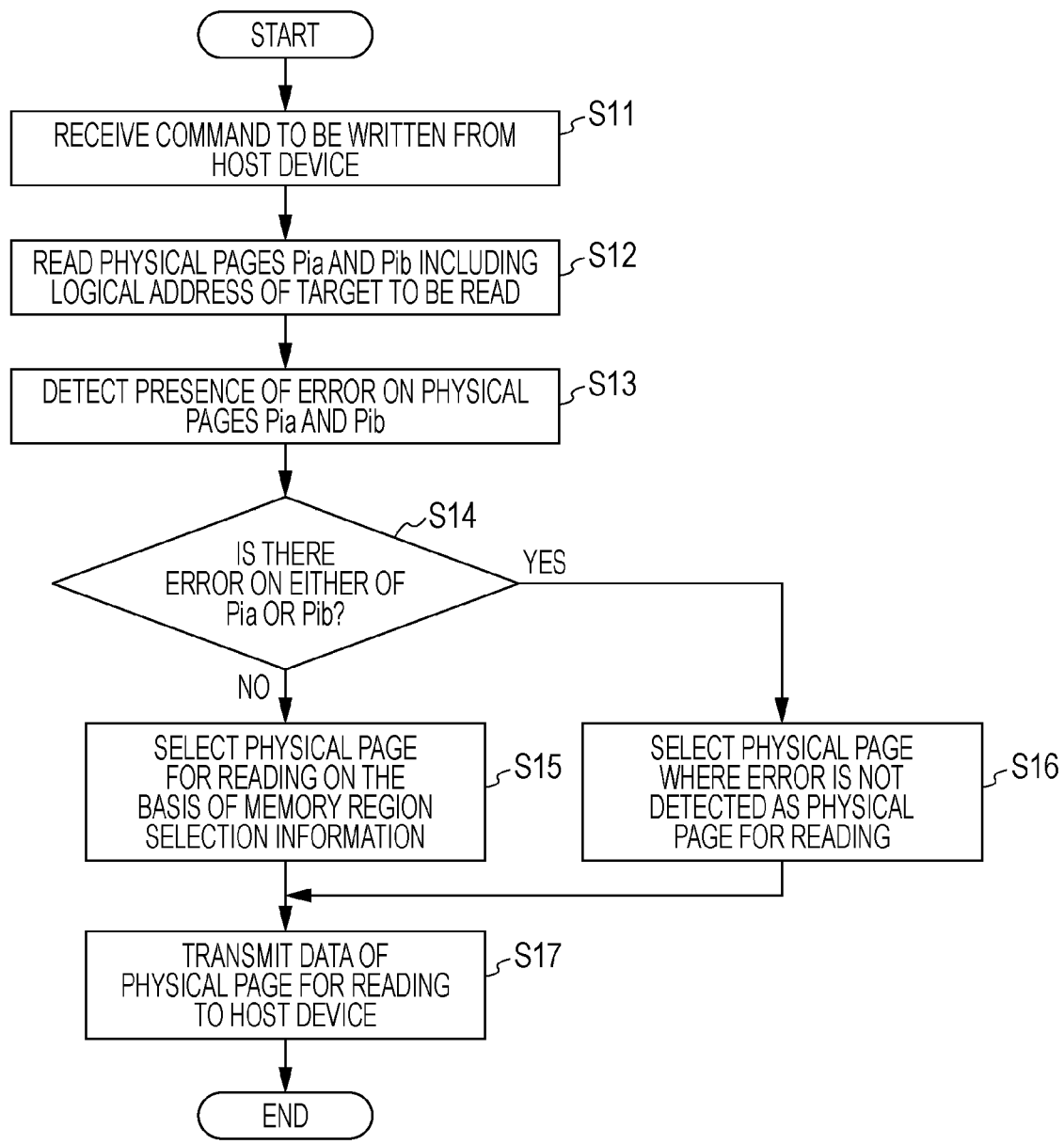
FIG. 8 is an example of a flowchart of reading control of the non-volatile memory device.

FIG. 8 is an example of a flowchart of reading control in the non-volatile memory device 100 according to the present embodiment.

First, the control unit 110 receives a command to be read from the host device 400 (step S11). Specifically, the control unit 110 decodes the received command and recognizes that the received command is the command to be read. The memory control unit 120 sequentially increments the logical address on the basis of the clock signal SCK from the host device 400.

Next, the memory control unit 120 reads information stored on physical pages Pia and Pib (i is an integer of 0 or more) including the region corresponding to the logical address of the target to be read (step S2). Subsequently, the error detection information on the physical pages Pia and Pib are analyzed and the presence of error is detected (step S13).

Next, the memory control unit 120 determines whether there is the error on either of physical pages Pia and Pib on the basis of the result of error detection (step S14). When the error is not detected on either page, the physical page for reading is selected on the basis of the memory selection information ASB-1 and ASB-2 (step S15). When the error is detected on any page, the physical page on which the error is not detected is selected as the physical page for reading (step S16).

Next, the memory control unit 120 reads the data stored on the physical page for reading and the control unit 110 transmits the data to be read to the host device 400 in synchronization with the clock signal SCK (step S17).

FIG. 9A, FIG. 9B and FIG. 9C are diagrams illustrating memory region selection by the memory control unit 120. Before executing the memory region selection, the memory control unit 120 detects the presence of error using the error detection information with respect to physical pages Pia and Pib of the target to be written or to be read. The memory control unit 120 selects the physical page for writing and the physical page for reading, as shown in FIG. 9A, on the basis of the error detection result. In other words, when the error is not detected (OK) on both of the physical pages Pia and Pib of the target to be written or to be read, the physical pages for writing and reading are selected on the basis of memory region selection information ASB. When the error is detected on any one of Pia and Pib (NG) and when the error is not detected on the other one (OK), the physical page on which the error is detected is selected as the physical page for writing and the physical page on which the error is not detected is selected as the physical page for reading. When the error is detected on both of Pia and Pib (NG), neither of the memory regions for writing and for reading is selected.

FIG. 9B shows a diagram illustrating the memory region selection on the basis of the memory region selection information ASB. As described in FIG. 9A, when the error is not detected on either of Pia and Pib (OK), the physical page for writing and for reading is selected according to the memory region selection information ASB-1 and ASB-2 as shown in FIG. 9B.

For example, when ASB-1 is 0 and ASB-2 is 0, the memory control unit 120 selects Pia as the physical page for writing and selects Pib as the physical page for reading. At the time of writing the data on Pia, the memory region selection information ASB-1 of Pia is rewritten from 0 to 1. By doing so, at the next time of writing the data, ASB-1 is changed into 1 and ASB-2 is changed into 0, therefore, the memory control unit 120 can write new data on Pib. At the time of writing the data on Pib, the memory region selection information ASB-2 on Pib is rewritten from 0 to 1. By doing so, at the next time of writing the data, the ASB-1 is changed into 1 and the ASB-2 is changed into 1, therefore, the memory control unit 120 can write the new data on Pia. At the time of writing the data on Pia, the memory region selection information ASB-1 on Pia is rewritten from 1 to 0.

As can be seen from the above, by following a selection rule shown in FIG. 9B, it is possible to perform the writing and reading by alternately selecting Pia and Pib.

Next, a case where the error is detected on any one of Pia and Pib and the error is not detected on the other will be described. In this case, as described in FIG. 9A, the physical page on which the error is detected is selected as the physical page for writing. For example, in a case of Pia on which the error is not detected and Pib on which the error is detected, Pib is selected as the physical page for writing and the data is written on Pib.

Here, at the time of writing the data on Pib, there are cases that the memory region selection information ASB-2 on Pib is rewritten and is not rewritten. As shown in FIG. 9C, when ASB-1 is 1 and ASB-2 is 0, ASB-2 is rewritten to 1. In addition, when ASB-1 is 0 and ASB-2 is 1, ASB-2 is rewritten to 0. In other cases, ASB-2 is not rewritten. By doing so, after the data is written on Pib, the memory region selection information ASB-1 is arranged to be 0 and ASB-2 is arranged to be 0 or ASB-1 is arranged to be 1 and ASB-2 is arranged to be 1. Accordingly, by following the selection rule shown in FIG. 9B, at the next time of memory access, it is possible to write new data on Pia.

According to the non-volatile memory device 100 of the present embodiment, when the error is not detected on either of the two physical pages including the logical address of the target to be written, the two physical pages are alternately selected and the writing and reading can be performed. In addition, when the error is detected from either of the two physical pages including the logical address of the target to be written, the physical page on which the error is detected is selected as the physical page for writing, the physical page on which the error is not detected is selected as the physical page for reading and the writing and reading can be performed.

Figure 10:
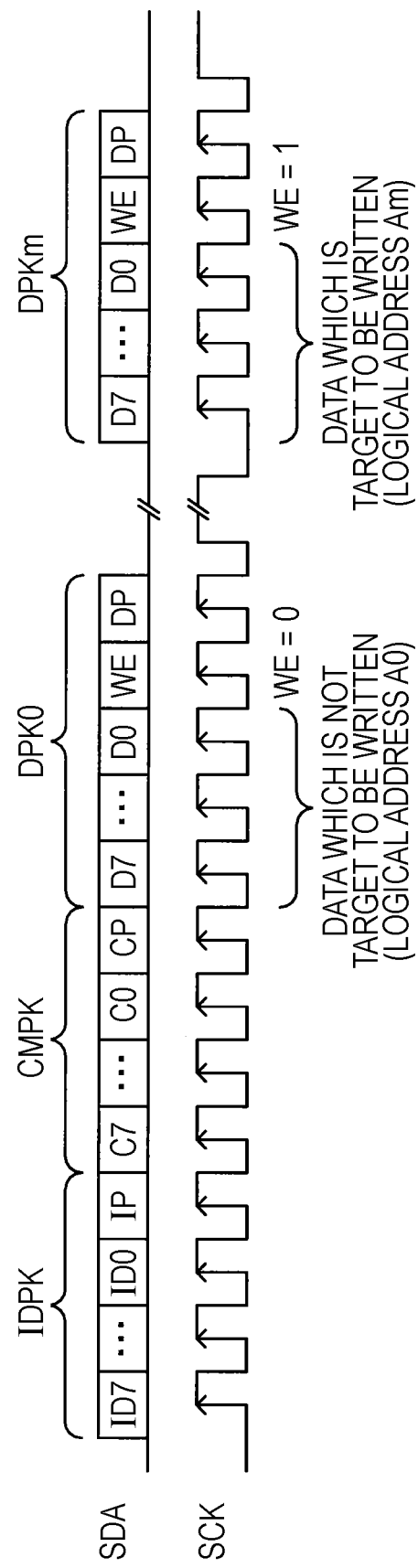
FIG. 10 is an example of an ID packet, a command packet and a data packet received by the non-volatile memory device.

FIG. 10 shows an example of an ID packet, a command pocket and a data packet received by the non-volatile memory device 100 according to the present embodiment.

As shown in FIG. 10, an ID packet IDPK is a packet regarding ID information of the non-volatile memory device 100, is configured by 8 bits of ID0 to ID7, for example, and a parity bit IP is added thereto. In addition, a command packet CMPK is configured by 8 bits of C0 to C7, for example, and a parity bit CP is added thereto. Moreover, a data packet DPK includes a data portion configured by 8 bits of D0 to D7, an writing enable bits WE and further includes a parity bit DP. The parity bits IP, CP and DP are bits added for the parity check and one parity bit is arranged to be added so as to be always an even number or an odd number.

Each of the packets are transmitted in order of the ID packet IDPK, the command packet CMPK and the data packet DPK in synchronization with the clock signal SCK from the host device 400. One data packet DPK corresponds to one logical address. An initial data packet DPK0 corresponds to the first logical address A0 and the next data packet DPK1 corresponds to the logical address A1.

As described above, when the writing enable bits WE are active (for example, WE=1), the memory control unit 120 determines the corresponding logical address as the logical address of the target to be written. In addition, when the writing enable bits WE are inactive (for example, WE=0), the memory control unit 120 determines the corresponding logical address as the logical address which is not the target to be written. For example, as shown in FIG. 10, since in the initial data packet DPK0, WE is 0, the logical address A0 is determined as the logical address which is not the target to be written. Moreover, since in the data packet DPKm (m is a natural number), WE is 1, a logical address Am is determined as the logical address of the target to be written.

According to the non-volatile memory device 100 of the present embodiment, by providing the writing enable bits WE, the logical address of the target to be written and the logical address which is not the target to be written can be distinguished. In addition, it is possible to set only the data of the data packet DPK corresponding to the logical address of the target to be written as the data to be written. As a result, since the data to be written may be received with respect to the logical address of the target to be written and the dummy data may be received with respect to the logical address which is not the target to be written, the data corruption due to the communication error can be reduced. Moreover, the data amount of data to be written prepared by the host device 400 can be reduced, thereby the capacity of data buffering of the host device 400 can be reduced.

Here, the configurations of each packet in the non-volatile memory device 100 according to the present embodiment are not limited to the configuration as shown in FIG. 10 and various modifications such as a portion of the configuration elements thereof is omitted, a portion of the configuration elements are replaced with other configuration elements, other configuration elements are added can be performed. For example, the number of bits in each of the packets may increase or decrease and the order of writing enable bits WE may be changed. In addition, the writing enable bits WE may be configured by not one bit but a plurality of bits.

2. Printing Material Container and Printer

Figure 11:
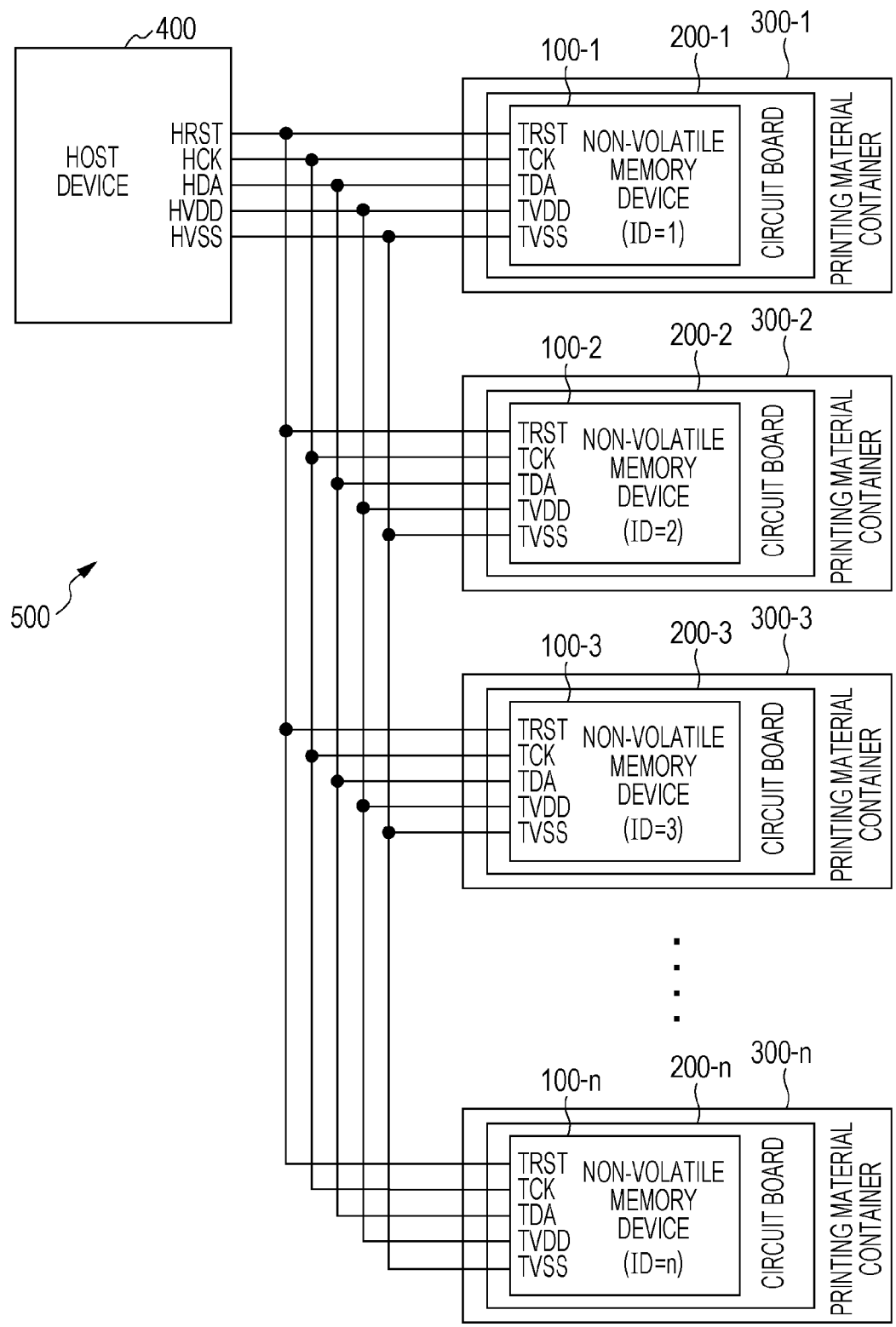
FIG. 11 is a basic configuration example of a printer.

FIG. 11 shows a basic configuration example of a printer 500 according to the present embodiment. The printer 500 of the present embodiment includes a first non-volatile memory device 100-1 to nth (n is an integer of 2 or more) non-volatile memory device 100-*n*, n circuit boards 200-1 to 200-*n*, n printing material containers 300-1 to 300-*n* and the host device 400. Here, the printer 500 according to the present embodiment is not limited to the configuration in FIG. 11 and various modifications such as a portion of the configuration elements thereof is omitted, a portion of the configuration elements are replaced with other configuration elements, other configuration elements are added can be performed.

The first non-volatile memory device 100-1 to nth non-volatile memory device 100-*n* respectively include reset terminals TRST, clock terminals TCK, data terminals TDA, a first power supply terminal TVDD and a second power supply terminal TVSS.

A reset signal RST from the host device 400 is input in the reset terminal TRST. A clock signal CLK from the host device 400 is input in the clock terminal TCK. A data signal SDA sent and received between the non-volatile memory device and the host device 400 is input and output in the data terminal TDA. The data signal SDA includes the command to be read, the command to be written, the data to be written or the like from the host device 400. The first power supply voltage VDD is supplied to the first power supply terminal TVDD from the host device 400 and the second power supply voltage VSS is supplied to the second power supply terminal TVSS from the host device 400.

As described above, each of these n non-volatile memory devices 100-1 to 100-*n* includes the non-volatile memory 130 or the like and ID (Identification) information (for example, ID=1, ID=2, ID=3 or the like), the ink consumption, ink color information and the like for identifying the printing material containers (for example, an ink cartridge or the like) 300-1 to 300-*n* are stored therein.

The host device 400 (printer main body) supplies the clock signal CLK to the non-volatile memory devices 100-1 to 100-*n* and performs a communication process of the data signal SDA among the non-volatile memory devices 100-1 to 100-*n*. When the host device 400 communicates with any one among the non-volatile memory devices 100-1 to 100-*n*, the ID packet IDPK is transmitted with respect to all of the non-volatile memory devices 100-1 to 100-N. When the ID information included in the received ID packet corresponds to the ID information stored in the non-volatile memory device itself, the non-volatile memory devices 100-1 to 100-*n* which receive the ID pack IDPK determine themselves as partners of communication with the host device and perform the communication process with the host device according to the command (to be read or to be written) included in the command packet CMPK which is received later. In addition, the host device 400 controls a printing process executed by the printer 500. The host device 400 includes the reset terminal HRST near the host, the clock terminal HCK near the host, the data terminal HDA near the host, the first power supply terminal HVDD near the host and the second power supply terminal HVSS near the host. The host device 400 counts the used ink amount every time when the printing process is performed and writes the ink consumption amount in the non-volatile memory device 100 on the basis of a counted value thereof.

Since the ink cartridge (printing material container) is generally configured to be exchangeable, the bad connection easily occurs in the electrical connection portion to connect the printer main body (host device) and the non-volatile memory device. For this reason, there is concern that the communication error due to the bad connection of the data signal terminal, a writing error due to the bad connection of the power supply terminal during the writing, or the like may occur.

As described above, according to the non-volatile memory device 100 of the present embodiment, when the error occurs on either of the two physical pages including the region corresponding to the logical address of the target to be written, the data to be written from the host device 400 and the copied data from the physical page on which the error does not occur can be written on the physical page on which the error occurs, therefore, it is possible to recover the data on the physical page on which the error occurs. By doing so, for example, even when the data such as the ink consumption (or remaining amount), stored in the non-volatile memory device 100, becomes the maximum value (or minimum value) due to a memory error, the correct data can be written at the next time of access. As a result, when the non-volatile memory device is applied to the ink cartridge of the printer, a problem in which the ink cannot be used even though the ink is remaining can be reduced and the high reliability of the printer can be realized.

Furthermore, according to the non-volatile memory device 100 of the present embodiment, the host device 400 may transmit the dummy data to the logical address which does not need to be written, thereby, the capacity of data buffering of the host device 400 can be reduced. As a result, it is possible to realize the efficient writing process.

Figure 12:
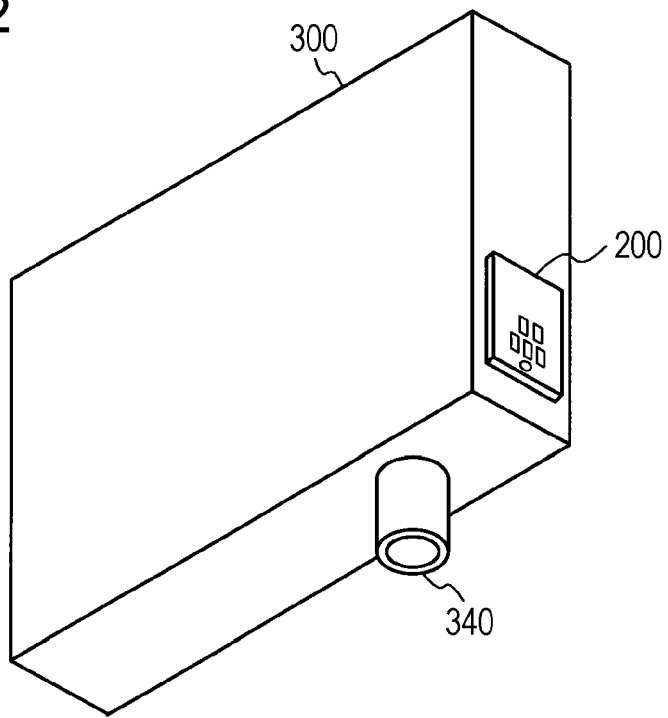
FIG. 12 is a detailed example of a configuration of a printing material container.

FIG. 12 shows a detailed configuration example of a printing material container (ink cartridge or liquid container) 300 of the present embodiment. An ink chamber for containing the ink, not shown, is formed inside the printing material container 300. In addition, in the printing material container 300, an ink supply port 340 which communicates with the ink chamber is provided. The ink supply port 340 is arranged to supply the ink to a print head unit when the printing material container 300 is installed to the printer.

The printing material container 300 includes a circuit board 200. In the circuit board 200, the non-volatile memory device 100 of the present embodiment is provided and the circuit board 200 stores the data such as the ink consumption amount and performs the transmitting and receiving of the data to and from the host device 400. The circuit board 200 is realized by a print substrate, for example, and is provided on the surface of the printing material container 300. In the circuit board 200, the terminals of the first power supply terminal TVDD or the like are provided. Therefore, when the printing material container 300 is installed to the printer, these terminals and terminals near the printer are connected (electrical connection), therefore, sending and receiving of the power supply or the data are performed.

Figure 13A:
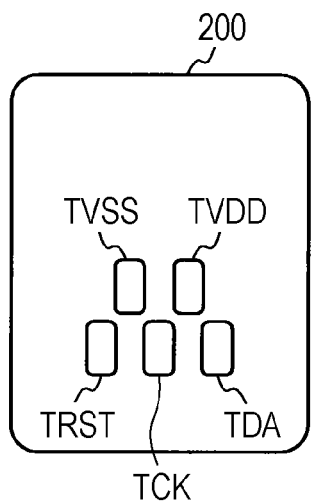
FIG. 13A and FIG. 13B are detailed examples of a configuration of a circuit board on which the non-volatile memory device is installed.
Figure 13B:
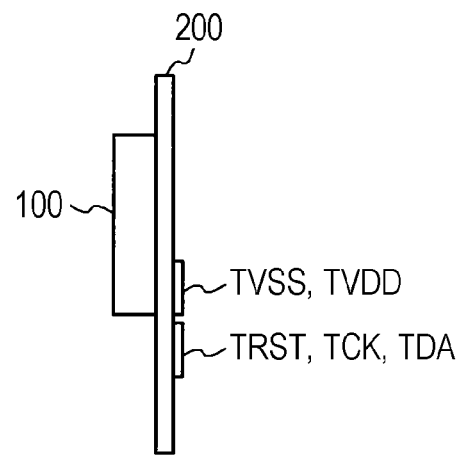

FIG. 13A and FIG. 13B show detailed configuration example of the circuit board 200 on which the non-volatile memory device 100 of the present embodiment is provided. As shown in FIG. 13A, a terminal group including a plurality of terminals is provided on the surface (surface connected to the printer) of the circuit board 200. The terminal group includes the first power supply terminal TVDD, the second power supply terminal TVSS, a reset terminal TRST, a clock terminal TCK and a data terminal TDA. Each of the terminals is realized by a metal terminal formed in a rectangular shape (substantially rectangular shape), for example. Each of the terminals is connected to the non-volatile memory device 100 through a wiring pattern layer or a through hole, not shown, provided on the circuit board 200.

As shown in FIG. 13B, on the rear surface (rear surface of the surface connected to the printer) of the circuit board 200, the non-volatile memory device 100 of the present embodiment is provided. As described above, the ink consumption amount (ink amount information), the ID information, using history information, manufacturing information or the like are stored in the non-volatile memory device 100. In addition, the present embodiment is described as above but it should be understood by those skilled in the art that various modifications may occur insofar as the modifications are substantially within new matters and effects of the present invention. Accordingly, the all examples of such modifications are included in the scope of the present invention. For example, in the specification or drawings, terms which are commonly described with different terms, which are used in the board sense or for the same meaning even at least one time, may be rewritten into the different terms thereof even in any parts of the specification or the drawings. Moreover, the configurations of the non-volatile memory device, the printing material container and the printer and the operation thereof are also not limited to the description of the present embodiment and variously modified embodiment may be applied.

What is claimed is:

1. A non-volatile memory device comprising:
a control unit performing a communication process with a host device;
a non-volatile memory including a first memory region and a second memory region storing data to be written transmitted from the host device; and
a memory control unit performing reading and writing of the non-volatile memory,
wherein the first memory region and second memory region are configured by each of physical pages,
wherein each of the physical pages is configured by a plurality of regions corresponding to a plurality of logical addresses,
wherein the memory control unit performs control of batch erasing and batch writing on every physical page,
wherein when a first physical page in the first memory region includes a first region corresponding to a first logical address, which is a target to be written, of the data to be written transmitted from the host device and when a second physical page in the second memory region includes a second region corresponding to the first logical address, which is a target to be written, the memory control unit selects either of the first physical page in the first memory region or the second physical page in the second memory region as a physical page for writing and selects the other as a physical page for reading,
wherein when the first physical page is selected as the physical page for writing, the memory control unit writes the data to be written in the first region corresponding to the first logical address which is the target to be written, and
wherein when the first physical page, selected as the physical page for writing, includes a third region corresponding to a second logical address which is not the target to be written and the second physical page, selected as the physical page for reading, includes a fourth region corresponding to the second logical address which is not the target to be written, the memory control unit copies and writes data stored in the fourth region corresponding to the second logical address which is not the target to be written in the third region corresponding to the second logical address which is not the target to be written.

2. The non-volatile memory device according to claim 1, wherein each of the first memory region and the second memory region stores memory region selection information in addition to the data to be written in every physical page or in every region corresponding to the logical address, and
wherein the memory control unit reads the memory region selection information from both of the first physical page including the first region corresponding to the first logical address of the target to be written and the second physical page including the second region corresponding to the first logical address, selects either of the first physical page or the second physical page as the physical page for writing on the basis of the memory region selection information and selects the other as the physical page for reading.

3. The non-volatile memory device according to claim 2, wherein each of the first memory region and second memory region stores error detection information in addition to the data to be written in every region corresponding to the logical address,
wherein the memory control unit reads the error detection information from both of the first physical page including the first region corresponding to the first logical address of the target to be written and the second physical page including the second region corresponding to the first logical address and analyzes the presence of the error, and
wherein when the error is detected from either of the first physical page or the second physical page, the memory control unit selects the physical page on which the error is detected as the physical page for writing and selects the physical page on which the error is not detected as the physical page for reading.

4. The non-volatile memory device according to claim 3,
wherein the memory control unit performs control to sequentially increment the logical address on the basis of a clock signal from the host device.

5. The non-volatile memory device according to claim 4,
wherein after receiving a command to be written from the host device, the control unit sequentially receives a receiving packet including the data to be written and writing enable bits by every logical address unit in synchronization with the clock signal, and
wherein when the memory control unit receives the receiving packet and writing enable bits to be active, the memory control unit sets the logical address corresponding to the receiving packet as the first logical address of the target to be written.

6. A printing material container comprising:
the volatile memory device according to claim 3.

7. A printer comprising:
the non-volatile memory device according to claim 3; and
a host device which communicates with the non-volatile memory device.

8. A circuit board comprising:
the non-volatile memory device according to claim 3.

* * * * *